United States Patent [19]
Grassl et al.

[11] Patent Number: 6,030,900
[45] Date of Patent: Feb. 29, 2000

[54] PROCESS FOR GENERATING A SPACE IN A STRUCTURE

[75] Inventors: Thomas Grassl, Freising; Manfred Engelhardt, Feldkirchen-Westerham, both of Germany

[73] Assignee: Siemens Aktiengesellschaft, Munich, Germany

[21] Appl. No.: 09/011,375

[22] PCT Filed: Jul. 12, 1996

[86] PCT No.: PCT/DE96/01277

§ 371 Date: Feb. 4, 1998

§ 102(e) Date: Feb. 4, 1998

[87] PCT Pub. No.: WO97/06556

PCT Pub. Date: Feb. 20, 1997

[30] Foreign Application Priority Data

Aug. 4, 1995 [DE] Germany ............... 195 28 746

[51] Int. Cl.[7] .................................................. H01L 21/44
[52] U.S. Cl. ............................................ 438/700; 438/703
[58] Field of Search .................................... 438/700, 703, 438/705, 706, 738

[56] References Cited

U.S. PATENT DOCUMENTS

| | | |
|---|---|---|
| 4,476,622 | 10/1984 | Cogan . |
| 5,069,747 | 12/1991 | Cathey et al. . |
| 5,182,221 | 1/1993 | Sato . |
| 5,223,736 | 6/1993 | Rodder . |
| 5,489,553 | 2/1996 | Chen . |
| 5,814,377 | 9/1998 | Robles et al. . |
| 5,849,635 | 12/1998 | Akram et al. . |

FOREIGN PATENT DOCUMENTS 0 597 603 A2  10/1993  European Pat. Off. .

OTHER PUBLICATIONS

Scott Pennington and Dale Hallock, A lowtemperature in situ deposition and planarizing phosphosilicate glass process for filling high aspect ratio topography, VMIC conference, pp. 71–75, Jun. 12, 1990.

H. Kotani et al. "Low temperature APCVD oxide using TEOS–ozone chemistry for multilevel interconnections", IEDM 89–669, pp. 28.2.1–28.2.4, 1989.

Y. Nishimoto et al. "dielectric film deposition by atmospheric pressure and low temperature VD using TEOS, Ozone and New Organometallic Doping Sources", VMIC conference, pp. 382–389, Jun. 12, 1989.

K. Fujino et al., "Dependence of deposition rate on base materials", VMIC conference, pp. 187–193, Jun. 12, 1990.

Mieko Suzuki, "A fully planarized multilevel interconnection technology using selective TEOS–Ozone APCVD", IEDM 92–293, pp. 11.3.1–11.3.4, 1992.

M.C. Broomfiled and T. A. Spooner, HDP dielectric BEOL gapfill: a process for manufacturing, IEEE/SEMI Adv. Semi. Manufacturing,conf., pp. 255–258, 1996.

S. Nag, "comparative evaluation of gapfill dielectrics in shallow trench isolation for sub 0.25 um technologies", IEDM 96–841, pp. 32.6.1–32.6.4, 1996.

Peter IEe et al., "Sub–atmospheric chemical vapor deposition (SACVD) of TEOS–ozone USG and BPSG" VMIC conference pp. 396–398,1990.

(List continued on next page.)

*Primary Examiner*—Charles Bowers
*Assistant Examiner*—Martin Sulsky
*Attorney, Agent, or Firm*—Hill & Simpson

[57] ABSTRACT

In a method for the production of a spacer layer in a structure in a first step a structure is produced by anisotropic dry etching, and in a further step an oxide layer is deposited with an organic silicon precursor at a pressure of p=0.2–1 bar and a temperature of 200° C. to 400° C.

17 Claims, 2 Drawing Sheets

OTHER PUBLICATIONS

Kwok et al., Surface Related Phenomena in Integrated PECVD/OZONE–TEOS SACVD Processes for Sub–Half Micron Gap Fill: Electrostatic Effects:, *J. Electrochem. Soc.*, vol. 141, No. 8, Aug. 1994.

Chanana et al., "Electrical Properties of 6.3 nm RF Oxygen Plasma Oxide Grown Near Room Temperature with *In Situ* Dry Cleaning of Si Surface", *Solid–State Electronics*, vol. 38, No. 5, pp. 1075–1080 (1995).

Homma et al., "A Fully Planarized Multilevel Interconnection Technology Using Semi–Selective Tetraethoxysilane–Ozone Chemical Vapor Deposition at Atmospheric Pressure", *J. Electrochem. Soc.*, vol. 140, No. 12, Dec. 1993.

Fry et al., "Applications of APCVD TEOS/$O_3$ Thin Films in ULSI IC Fabrication", *Solid State Technology*, vol. 37, No. 3, pp. 31–40, Mar. 1994.

Becker et al., "Low Pressure Deposition of Doped $SiO_2$ by Pyrolysis of Tetraethylorthosilicate (TEOS)", *Journal of the Electrochemical Society*, vol. 136, No. 10, pp. 3033–3043, Oct. 1989.

Derwent Research Disclosure Bd. 327, Nr. 019, 1991—"Semiconductor Trench Isolate Deposit Tetra Ethyl Orthosilicate Film CVD Produce".

PROCESS FOR GENERATING A SPACE IN A STRUCTURE

FIELD OF THE INVENTION

The present invention relates to a method for the production of a spacer layer in a structure.

BACKGROUND OF THE INVENTION

Spacer layers, so-called spacers, have acquired great importance in semiconductor technology.

Spacers are produced, for example, in a structure, for example a hole or a trench, in order to bring about lateral electrical insulation of holes, passages or trenches, to deposit so-called seed layers or to incorporate diffusion barriers.

Silicon dioxide ($SiO_2$) is typically used as the material for the production of an insulating spacer.

A conventional method for the production of an $SiO_2$ spacer is described below with reference to FIG. 1.

FIG. 1 illustrates a structure 100, which in this cause may be a trench, for example, prior to the deposition of the material forming the spacer. In the example shown in FIG. 1a, the structure 100 is formed in a multilayer structure comprising a first layer 102 and a second layer 104.

The first layer 102 is typically a silicon substrate with transistors (front end), and the second layer 104 is used for the interconnection (metallization) of the transistors (back end), the second layer 104 being composed of $SiO_2$ into which metal tracks are embedded.

After the formation of the structure 100, $SiO_2$ is deposited, thereby forming an $SiO_2$ layer 106 on the surface of the layer 104, on the side walls of the structure 100 and on the bottom of the structure 100, as is shown in FIG. 1b.

The spacer is completed by carrying out anisotropic plasma etching, by means of which the bottom 108 of the structure 100 is exposed, as can be seen in FIG. 1c.

At the same time, the $SiO_2$ layer 106 above the layer 104 and a small part of the layer 104 are removed by the plasma etching, since the etching rate on the surface of the water is greater than on the bottom of the structure, as can likewise be gathered from FIG. 1c.

It is evident from the above description of the method known from the prior art that this known method for the production of a spacer in a structure encompasses a complicated sequence of steps, comprising the steps of producing the structure, depositing the material from which the spacer is to be produced, and the step of exposing the bottom of the structure by an etching process, the different etching rates on the surface of the water and on the bottom of the structure becoming increasingly problematic in the context of present-day structures which are becoming ever deeper.

Reference is made to the fact that the above-described conventional method from the prior is not suitable solely for removing an $SiO_2$ layer from a bottom 108 of a structure 100, rather $SiO_2$ layers are generally removed from horizontal regions in this way.

SUMMARY OF THE INVENTION

Taking the prior art described above as a starting point, the present invention is based on the object of providing a simplified method for the production of a spacer layer in a structure.

The present invention provides a method for the production of a spacer layer in a structure having the following steps:

anisotropic dry etching of a layer to be structured, in order to produce the structure;

cleaning etching residues from the structure; and deposition of silicon dioxide with an organic silicon precursor and ozone at a pressure of p=0.2–1 bar and a temperature of 200° C. to 400° C.

The present invention is based on the insight that the anisotropic dry etching for producing the structure brings about the occurrence of instances of damage, modification and/or contamination or implantation primarily on the bottom of a structure. The duration of a following wet etching step for cleaning etching residues from all of the surfaces, typically by means of 1–3% strength hydrofluoric acid (HF), must be chosen to be short enough for the side walls of the structure to be cleaned, but not for the modification of the structure bottom to be completely removed. Suitable process control during the subsequent conformal deposition of the layer forming the spacer has the effect that deposition on the bottom of the structure does not happen, with the result that only the desired lateral spacer is produced by the deposition process. As additional etching step such as is required to conclude the known method acknowledged above is consequently disposed with.

According to a preferred exemplary embodiment of the present invention, the wet-chemical cleaning is typically carried out by means of a 1–3% strength hydrofluoric acid (HF).

According to a further preferred exemplary embodiment of the present invention, the deposition of the silicon precursors takes place by means of an $O_3$-TEOS-CVD process.

In an embodiment, the present invention provides a method for producing a spacer in a structure that includes the step of anistropically dry etching the structure so that a bottom surface is formed and at least one sidewall surface extends from the bottom surface and through the top of the structure. The bottom surface also has at least one modification that gives the bottom surface at least one surface characteristic that differentiates the bottom surface from the sidewall surface. The bottom and sidewall surfaces also carry etching residues after the etching step. Next, the bottom and sidewall surfaces are cleaned of the etching residues. Then, the bottom and sidewall surfaces are exposed to form silicon dioxide with an organic silicon precursor and ozone at a pressure ranging from about 0.2 bar to about 1 bar at a temperature ranging from about 200° C. to about 400° C. whereby the silicon dioxide is deposited onto the sidewall surface but not on the bottom surface due to the different surface characteristic of the bottom surface.

In an embodiment, the etching residues are cleaned with a hydrofluoric acid solution that has a hydrofluoric acid concentration ranging from about 1% to about 3%.

In an embodiment, the cleaning step is carried out without altering the modification of the bottom surface.

In an embodiment, the step of exposing the sidewall and bottom surfaces to silicon dioxide with an organic silicon precursor further comprises a spraying process wherein tetraethyl orthosilicate, helium, oxygen and ozone are sprayed onto the structure from a distance ranging from about 5 mm to about 25 mm. The combined flowrate of the oxygen and ozone ranges from about 1000 sccm to about 10,000 sccm at an oxygen/ozone weight ratio ranging from about 5% to about 20%. A combined flowrate for the tetraethyl orthosilicate and helium ranges from about 100 sccm to about 3000 sccm.

It is therefore an advantage of the present invention to provide an improved method of producing a spacer in a multi-layer structure which eliminates a final etching step previously required to remove the silicon dioxide layer from the bottom surface.

Other objects and advantages of the present invention will become apparent upon reviewing the following detailed description of the invention, drawings and appended claims.

BRIEF DESCRIPTION OF THE DRAWINGS

Preferred exemplary embodiments of the present invention are described in more detail below with reference to the appended drawings, in which.

DETAILED DESCRIPTION OF THE PRESENTLY PREFERRED EMBODIMENTS

Figure 2:
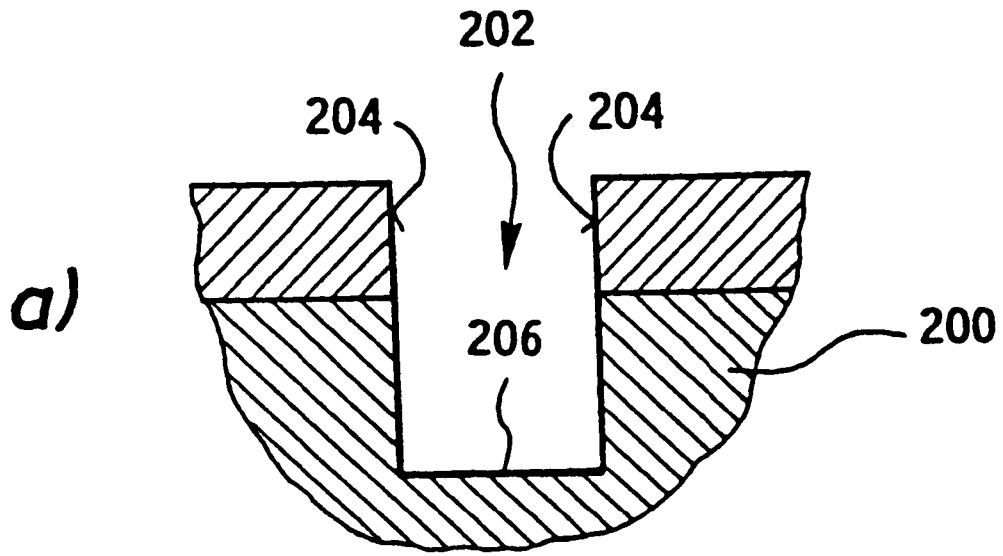
FIG. 2(a–b) illustrates the steps necessary for producing the spacer according to the method of the present invention.
Figure 2:
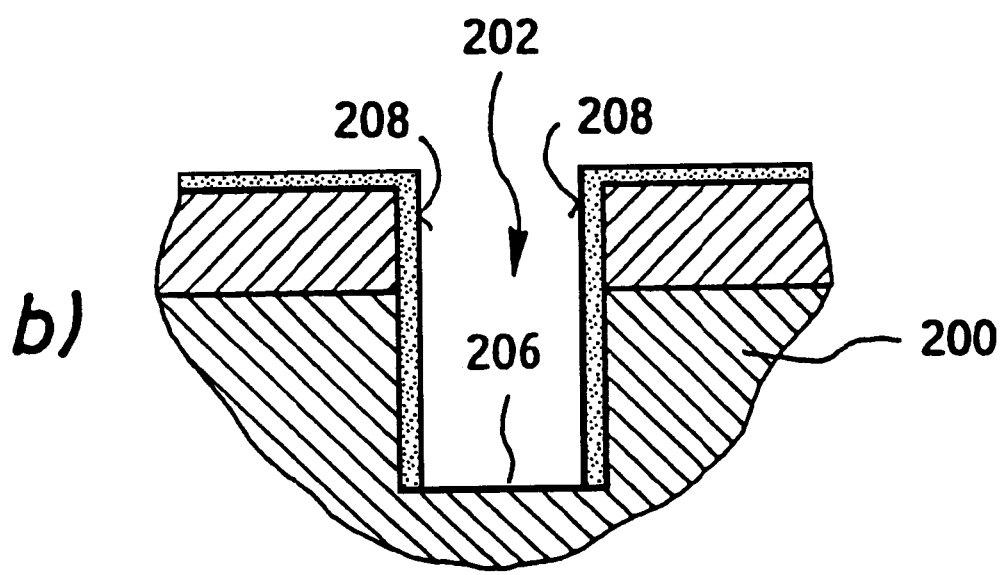

The method according to the invention is described in more detail below with reference to FIG. 2.

Anisotropic dry etching of a layer 200 to be structured is carried out in a first step, in order to produce the structure 202.

This first step yields a structure such as the one illustrated in FIG. 2a.

The structure 202 illustrated in FIG. 2a, for example in the form of a trench or a hole, includes side walls 204 and a bottom 206.

The layer 200 is a substrate or a wafer, for example.

Figure 1:
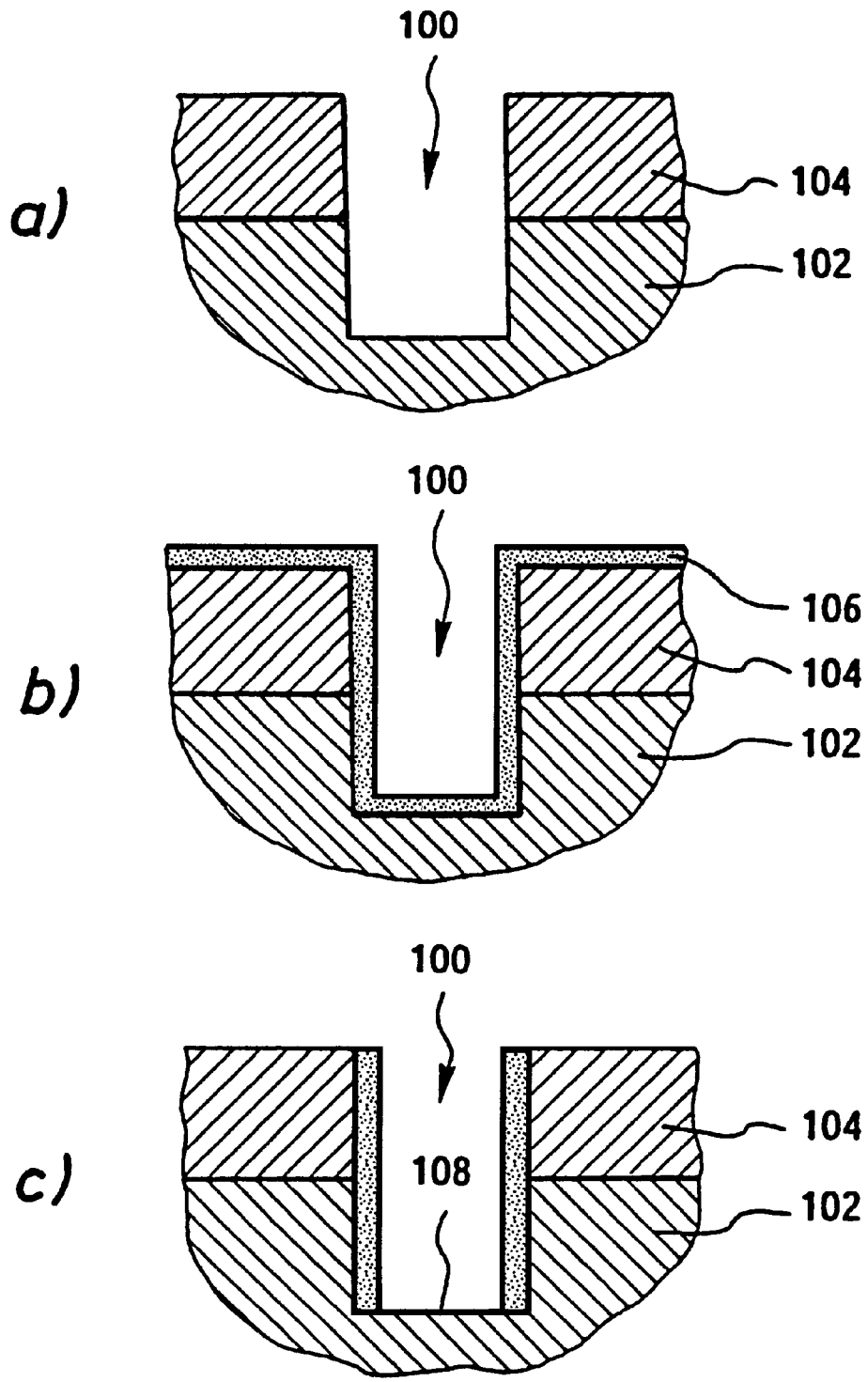
FIG. 1(a–c) illustrates the steps necessary for producing a spacer according to a method of the prior art.

Reference is made to the fact that the layer 200 to be structured does not have to be produced from a single layer, rather it can also be formed from a plurality of layers, as has already been described with reference to FIG. 1.

It is also possible to use wafers which have already been ready processed.

The selection of the type of the layer 200 to be structured depends directly on the intended application and consequently differs in different semiconductor production technologies.

In the exemplary embodiment described here, the anisotropic dry etching is performed by means of anisotropic plasma etching.

The anisotropic plasma etching process by which the structure 202 is produced, on the side walls 204 of which the spacer is to be produced, brings about, on account of the anisotropy of the plasma etching processes, the occurrence of instances of damage, modification and/or contamination or implantation primarily on the bottom 206 of the structure 202. The result of this is that already, during the production of the structure, the bottom 206 of the structure 202 is pretreated differently from the side walls 204.

This different pretreatment constitutes a first essential feature of the method according to the present invention. Reference is made to the fact that this different pretreatment can also be effected by other anisotropic dry etching processes.

The contamination and etching residues that arise must be removed after the etching process. This can be done, for example, by a wet-chemical cleaning step or an isotropic plasma cleaning step.

In a next step, silicon dioxide ($SiO_2$) is deposited with an organic silicon precursor and ozone, at a pressure of p=0.2–1 bar and a temperature of 200° C.–400° C., on the layer 200 to be structured and in the regions of the structure 202. Organic silicon precursors are known per se by those skilled in the art and designate materials which form silicon precursors.

This deposition of organic silicon precursors with the process parameters specified above constitutes suitable process control for the conformal deposition of the spacer.

On account of the process control, described above with reference to FIG. 2a, during the production of the structure 202, the conformal deposition has the effect that deposition does not happen on the bottom 206 of the structure 202. As a result, only the spacer 208 is produced by the deposition, as can be seen in FIG. 2b.

Lateral electrical insulation is realized, for example, by this spacer.

According to a preferred exemplary embodiment, the $SiO_2$ deposition is carried out by means of a so-called TEOS process using TEOS (TEOS=tetraethyl orthosilicate) as silicon precursor.

Yet again in accordance with a further preferred exemplary embodiment of the present invention, the abovementioned TEOS process is carried out by means of an $O_3$-TEOS-CVD process. The process parameters required for this process are as follows:

Distance between the wafer and gas spray: 5–25 mm (A device for carrying out the $O_3$-TEOS-CVD process is known per se by those skilled in the art, so that the abovementioned distance between the wafer and the gas spray does not have to be explained in more detail.)

(oxygen+ozone) flow: 1000–10,000 sccm (TEOS+helium) flow: 100–3000 sccm

Proportion of ozone in the oxygen/ozone mixture: 5–20% by weight

The $O_3$-TEOS-CVD process is a so-called SACVD process (SACVD=subatmospheric chemical vapour deposition).

Reference is made to the fact that, in addition to the trenches or holes described above, it is also possible to use other structures in the case of which it is desired to keep a bottom region of these structures free, whereas spacers or oxide spacers are to be formed on the side walls.

Although the invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. A method for the production of a spacer in a structure, the method comprising the following steps:

anisotropic dry etching of the structure so that a bottom surface is formed and at least one sidewall surface extends from the bottom surface through a top of the structure, the bottom surface having at least one modification that gives the bottom surface at least one surface characteristic that is different from a corresponding surface characteristic of the sidewall surface, the bottom and sidewall surfaces carrying etching residues;

cleaning the etching residues from bottom and sidewall surfaces; and exposing the bottom surface and sidewall surface to form silicon dioxide with an organic silicon precursor and ozone at a pressure ranging from about 0.2 bar to about 1 bar at a temperature ranging from about 200° C. to about 400° C. whereby, silicon dioxide is deposited onto the sidewall surface but not on the bottom surface due to the different surface characteristic of the bottom surface.

2. The method of claim 1 wherein the bottom layer is a wafer.

3. The method of claim 1 wherein the cleaning step further comprises removing the etching residues from the side walls of the structure without substantially altering the modification of the bottom surface.

4. The method of claim 1 wherein the spacer is formed in a trench.

5. The method of claim 1 wherein the spacer is formed in a hole.

6. The method of claim 1 wherein the exposing step further comprises a spraying process wherein tetraethyl orthosilicate, helium, oxygen and ozone are sprayed into the structure from a distance ranging from about 5 mm to about 25 mm.

7. The method of claim 6 wherein the spraying process is further comprises a combined flowrate for oxygen and ozone ranges from about 1000 sccm to about 10,000 sccm at an oxygen/ozone weight ratio of ranging from about 5% to about 20%.

8. The method of claim 7 wherein the spraying process is further characterized as comprising a combined flowrate for tetraethyl orthosilicate and helium ranges from about 100 sccm to about 3000 sccm.

9. The method of claim 1 wherein the cleaning step further comprises cleaning the bottom and sidewall surfaces with hydrofluoric acid solution.

10. The method of claim 9 wherein the hydrofluoric acid solution comprises from about 1% to about 3% hydrofluoric acid by weight.

11. A method for the production of a spacer in a structure having a top surface, the method comprising the following steps:

- anisotropic dry etching of the structure so that a bottom surface is formed and at least one sidewall surface extends from the bottom surface through the top surface of the structure, the bottom surface having at least one modification that gives the bottom surface at least one surface characteristic that is different from a corresponding surface characteristic of a portion of the sidewall surface, the bottom and sidewall surfaces carrying etching residues;
- cleaning the etching residues from bottom and sidewall surfaces with a hydrofluoric acid solution which does not alter the modification of the bottom surface; and
- exposing the bottom surface and sidewall surface to form silicon dioxide with an organic silicon precursor and ozone at a pressure ranging from about 0.2 bar to about 1 bar at a temperature ranging from about 200° C. to about 400° C. whereby, silicon dioxide is deposited onto the sidewall surface but not on the bottom surface due to the modification of the bottom surface.

12. The method of claim 11 wherein the structure comprises a silicon wafer.

13. The method of claim 11 wherein the spacer is formed in a trench.

14. The method of claim 11 wherein the spacer is formed in a hole.

15. The method of claim 11 wherein the exposing step further comprises a spraying process wherein tetraethyl orthosilicate, helium, oxygen and ozone are sprayed into the structure from a distance ranging from about 5 mm to about 25 mm, wherein a combined flowrate for oxygen and ozone ranges from about 1000 sccm to about 10,000 sccm at an oxygen/ozone weight ratio of ranging from about 5% to about 20%, and wherein a combined flowrate for tetraethyl orthosilicate and helium ranges from about 100 sccm to about 3000 sccm.

16. The method of claim 11 wherein the hydrofluoric acid solution comprises from about 1% to about 3% hydrofluoric acid by weight.

17. A method for the production of a spacer in a structure having at least two layers including a top layer disposed on top of a bottom layer, the method comprising the following steps:

- anisotropic dry etching of the structure so that a bottom surface is formed in the bottom layer and at least one sidewall surface extends from the bottom surface through the top layer, the bottom surface having at least one modification that gives the bottom surface at least one surface characteristic that is different from a corresponding surface characteristic of a portion of the sidewall surface that extends through the bottom layer and a portion of the sidewall surface that extends through the top layer, the bottom and sidewall surfaces carrying etching residues;
- cleaning the etching residues from bottom and sidewall surfaces with a hydrofluoric acid solution which does not alter the modification of the bottom surface, the hydrofluoric acid solution comprises from about 1% to about 3% hydrofluoric acid by weight; and
- exposing the bottom surface and sidewall surface to form silicon dioxide with an organic silicon precursor and ozone at a pressure ranging from about 0.2 bar to about 1 bar at a temperature ranging from about 200° C. to about 400° C. by means of a spraying process wherein tetraethyl orthosilicate, helium, oxygen and ozone are sprayed into the structure from a distance ranging from about 5 mm to about 25 mm, wherein a combined flowrate for oxygen and ozone ranges from about 1000 sccm to about 10,000 sccm at an oxygen/ozone weight ratio of ranging from about 5% to about 20%, and wherein a combined flowrate for tetraethyl orthosilicate and helium ranges from about 100 sccm to about 3000 sccm, whereby silicon dioxide is deposited onto the sidewall surface but not on the bottom surface due to the modification of the bottom surface.

* * * * *